(12) United States Patent
Smith et al.

(10) Patent No.: US 6,903,993 B2
(45) Date of Patent: *Jun. 7, 2005

(54) MEMORY CELL WITH FUSE ELEMENT

(75) Inventors: Douglas D. Smith, Mesa, AZ (US); Myron Buer, Gilbert, AZ (US); Laurentiu Vasiliu, San Diego, CA (US); Bassem Radieddine, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/764,239
(22) Filed: Jan. 22, 2004
(65) Prior Publication Data US 2004/0151049 A1 Aug. 5, 2004

Related U.S. Application Data

(63) Continuation of application No. 10/352,417, filed on Jan. 28, 2003, which is a continuation of application No. 10/025,132, filed on Dec. 18, 2001, now Pat. No. 6,525,955, and a continuation-in-part of application No. 10/012,858, filed on Nov. 3, 2001, now Pat. No. 6,639,866.
(60) Provisional application No. 60/245,913, filed on Nov. 3, 2000.

(51) Int. Cl.$^7$ .................................................. G11C 7/00
(52) U.S. Cl. .............................. 365/225.7; 365/189.11; 365/104
(58) Field of Search ..................... 365/225.7, 189.11, 365/104, 189.12, 72, 96

(56) References Cited

U.S. PATENT DOCUMENTS 6,041,007 A * 3/2000 Roeckner ................. 365/225.7

* cited by examiner

Primary Examiner—David Lam
(74) Attorney, Agent, or Firm—McAndrews, Held, & Malloy, Ltd.

(57) ABSTRACT

The present invention relates to a programmable memory device and a method of setting a state for a programmable memory device. In at least one embodiment, the memory device comprises at least a level shifter adapted to stand off a high programing voltage to at least one fuse element in the memory device, wherein the high programming voltage is used to set a state of the memory device.

28 Claims, 6 Drawing Sheets

MEMORY CELL WITH FUSE ELEMENT

CROSS REFERENCE TO RELATED APPLICATIONS

The present application is a continuation of U.S. application Ser. No. 10/352,417 filed Jan. 28, 2003 titled "Memory Cell With Fuse Element" which is a continuation of U.S. application Ser. No. 10/025,132 filed Dec. 18, 2001 titled "Memory Cell With Fuse Element" now U.S. Pat. No. 6,525,955 issue Feb. 25, 2003, the complete subject matter of each of which is incorporated herein by reference in its entirety.

U.S. application Ser. No. 10/352,417 is also a continuation-in-part of patent application Ser. No. 10/012,858 filed Nov. 3, 2001 titled "Very Small Swing High Performance Asynchronous CMOS Static Memory (Multi-Port Register File) With Power Reducing Column Multi-plexing Scheme" now U.S. Pat. No. 6,639,866 issued Oct. 28, 2003, which in turn claims priority from Provisional Application No. 60/245,913 filed Nov. 3, 2000.

FEDERALLY SPONSORED RESEARCH OR DEVELOPMENT

[Not Applicable]

SEQUENCE LISTING

[Not Applicable]

BACKGROUND OF THE INVENTION

One embodiment of the present invention relates to a memory cell with a gated fuse element. More specifically, one embodiment of the present invention relates to a one time programmable memory cell with thin gate-ox fuse elements.

There are two main types of memory cells or devices used in the field of data storage. The first type is volatile memory that has the information stored in a particular memory cell, where the information is lost the instant power is removed. The second type is a non-volatile memory cell in which the information is preserved even with the power removed. Of the second type, some designs provide for multiple programming while other designs provide for one-time programming. Typically, the manufacturing techniques used to form such non-volatile memories are quite different from a standard logic processes, thereby dramatically increasing the complexity and chip size of such memories.

One-time programmable memory cells or devices have numerous applications, specifically long-term applications. For example, one-time programmable memory cells may be used in post package programming to install security codes, keys or identifiers. These codes, keys or identifiers cannot be electrically altered or decoded without destroying the circuitry. Further, such one-time programmable memory cells or devices may be used to make a device unique for a specific application. Alternatively, such memory cells or devices may be used as memory elements in programmable logic and read only memory devices.

One known one-time programmable memory cell uses storage elements combined with poly fuses. Poly fuses in general are resistors that require a great deal of current, on the order of many milliamps, to set the state of (i.e., "blow") the fuse. Building a memory device array using such poly fuse elements requires adding a switch to the array, used to switch the current through the selected fuse to be blown. Adding such a switch to a memory cell adds to the overall size of the memory cell, increasing manufacturing cost.

Another limitation associated with a poly fuse is that the resistance ratio of the poly fuse is fairly close together, having only about one order of magnitude difference in value. In other words, the resistance of poly fuses before the blow and the resistance after the blow is fairly close. Therefore, sensing the difference between a blown and un-blown poly fuse is difficult, requiring the addition of a very large operational amplifier into the circuit to sense the state of the fuses. Adding such an operational amplifier to a memory cell adds to the overall size of the memory cell, increasing manufacturing cost.

Further, it is difficult to control the programmed state resistance of the poly fuses. For example, one conventional programmed poly fuse may have a resistance of a few kilo ohms, while a neighboring poly fuse in the same memory cell array may have a resistance in the range of 10 to 100 kilo ohms.

Yet another limitation of the conventional poly fuses is the instability of their programmed state resistance. Specifically, the resistance of the programmed poly fuses tends to increase over time. In the worst case, the programmed poly fuse may actually switch from the programmed state to an unprogrammed state resulting in circuit failure.

CMOS technology is the integration of both NMOS and PMOS transistors on a silicon substrate. The NMOS transistor consists of a N-type doped polysilicon gate, a channel conduction region, and source/drain regions formed by diffusion of N-type dopant in the silicon substrate. The channel region separates the source from the drain in the lateral direction, whereas a layer of dielectric material that prevents electrical current flow separates the polysilicon gate from the channel. Similarly, the PMOS transistor architecture is the same as the NMOS transistor provided previously but using a P-type dopant.

The dielectric material separating the polysilicon gate from the channel region usually consists of thermally grown silicon dioxide ($SiO_2$) material (referred to as the gate oxide or oxide) that leaks very little current through a mechanism called Fowler-Nordheim tunneling under voltage stress. When the transistor is stressed beyond a critical electrical field (applied voltage divided by the thickness of the oxide) the oxide ruptures, destroying (referred to as "blowing") the transistor.

Thin gate oxides allow direct tunneling current to behave quite differently than thicker oxides that exhibit Fowler-Nordheim tunneling. Rupturing the thin oxide requires consideration for pulse width duration and amplitude to limit power through the gate oxide to produce reliable, low resistance gate-ox fuse transistors.

Rupturing the gate oxide is one technique used to program a non-volatile memory array. U.S. Pat. No. 6,044,012 discloses a technique for rupturing the gate oxide of a transistor. But here the oxide is about 40 to 70 Å thick. The probability of direct tunneling, rather than Fowler-Nordheim tunneling, of gate current through an oxide of this thickness is extremely low. Furthermore, the voltage required to rupture this thick oxide is substantially high and requires using a charge pump circuit. The '012 patent does not disclose a final programmed resistance, but is believed to be in the high kilo ohms range.

U.S. Pat. No. 5,886,392 discloses a one-time programmable element having a controlled programmed state resistance with multiple fuses. Both the final resistance values are in the high kilo ohms range and the spread of these values is wide as well. Again, a complicated circuit would have to be designed if the final resistance is not within a tight range. Adding more fuses may lower the resistance but increases the die size.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in memory cell or device and method of programming a memory cell. In one embodiment, the memory cell comprises a storage element adapted to store data and a gated device coupled to the storage element, adapted to set a state of the memory cell or device.

In yet another embodiment, the present invention relates to a one-time programmable memory cell comprising a storage element adapted to store data and at least one thin gate-ox fuse coupled to the storage element, adapted to set a state of the memory cell.

In another embodiment, the present invention relates to a one-time programmable memory cell comprising a storage element adapted to store data and two gated fuses coupled to the storage element, adapted to set a state of the memory cell. A level shifter is connected to the gated fuses and is adapted to stand off a high voltage when setting the state of the memory cell. At least one switch transistor is connected to at least the level shifter and is adapted to select at least one of the gated fuses, enabling a high voltage to be communicated thereto, thus setting the state of the memory cell. A programming device is coupled to the storage element and is adapted to keep at least one of the gated fuses low when setting the state of the memory cell.

One embodiment for setting the state of the memory cell is also contemplated. This method comprises setting the state of a memory cell having at least one thin oxide gated fuse, by rupturing the at least one thin oxide gated fuse. Rupturing the thin oxide fuse comprises creating less than about a 6 volt difference across the fuse. More specifically, rupturing the thin oxide gated fuse comprises creating about a 5 volt difference across the fuse.

Other aspects, advantages and novel features of the present invention, as well as details of an illustrated embodiment thereof, will be more fully understood from the following description and drawings, wherein like numerals refer to like parts.

DETAILED DESCRIPTION OF THE INVENTION

Commonly assigned application Ser. No. 09/739,752, the complete subject matter of which is incorporated herein by reference, discloses the physical current used to rupture, breakdown or blow the gated fuse having an oxide with a thickness of about 2.5 nm or less (alternatively referred to as "thin oxide or thin gate-ox fuse"). In this embodiment, the physical current is dominated by a different mechanism than in prior art fuses fabricated according to 0.35 $\mu$m and 0.28 $\mu$m process technologies. In the present invention, the oxide rupture may be more controlled and the final programmed resistance is much lower than conventional memory devices using poly fuses. A smaller variance on programmed resistance provides for a more compact circuit design to determine the state of the memory cell. Moreover, the lower voltage required to rupture the oxide of the gate-ox fuse means no charge pump circuitry is required, thus providing for a simpler memory cell array design and smaller circuitry requirement.

Figure 1:
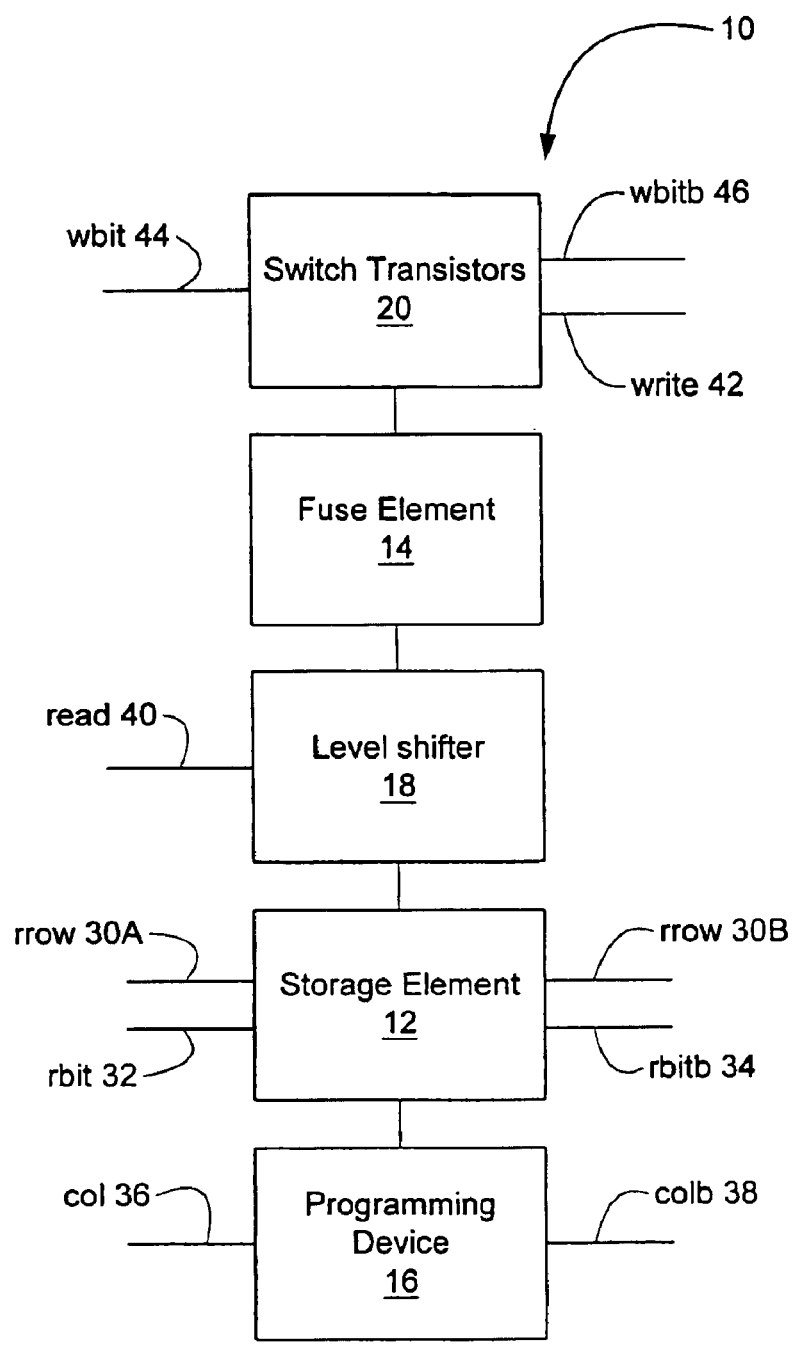
FIG. 1 illustrates a block diagram of a memory cell having a storage element and gated fuses in accordance with one embodiment of the present invention.

FIG. 1 illustrates a block diagram of a memory cell or device in accordance with one embodiment of the present invention. More particularly, FIG. 1 illustrates a one-time programmable memory cell or device 10. In this embodiment, the memory cell 10 comprises at least a storage element 12 and thin gate-ox fuse element 14 connected, coupled or otherwise communicating thereto. Additionally, the memory cell 10 comprises programming device 16, level shifter 18 and switch transistors 20 as shown.

FIG. 1 further illustrates a plurality of electrical connections or couplings. Electrical connections col 36 and colb 38 are shown coupled to programming device 16. The connections rrow 30A and 30B, rbit 32 and rbitb 34 are shown connected, coupled or otherwise communicating with storage element 12. The read connection 40 is shown coupled to level shifter 18. Furthermore, wbit 44, wbitb 46 and write 42 are shown connected to switch transistors 20.

Figure 2:
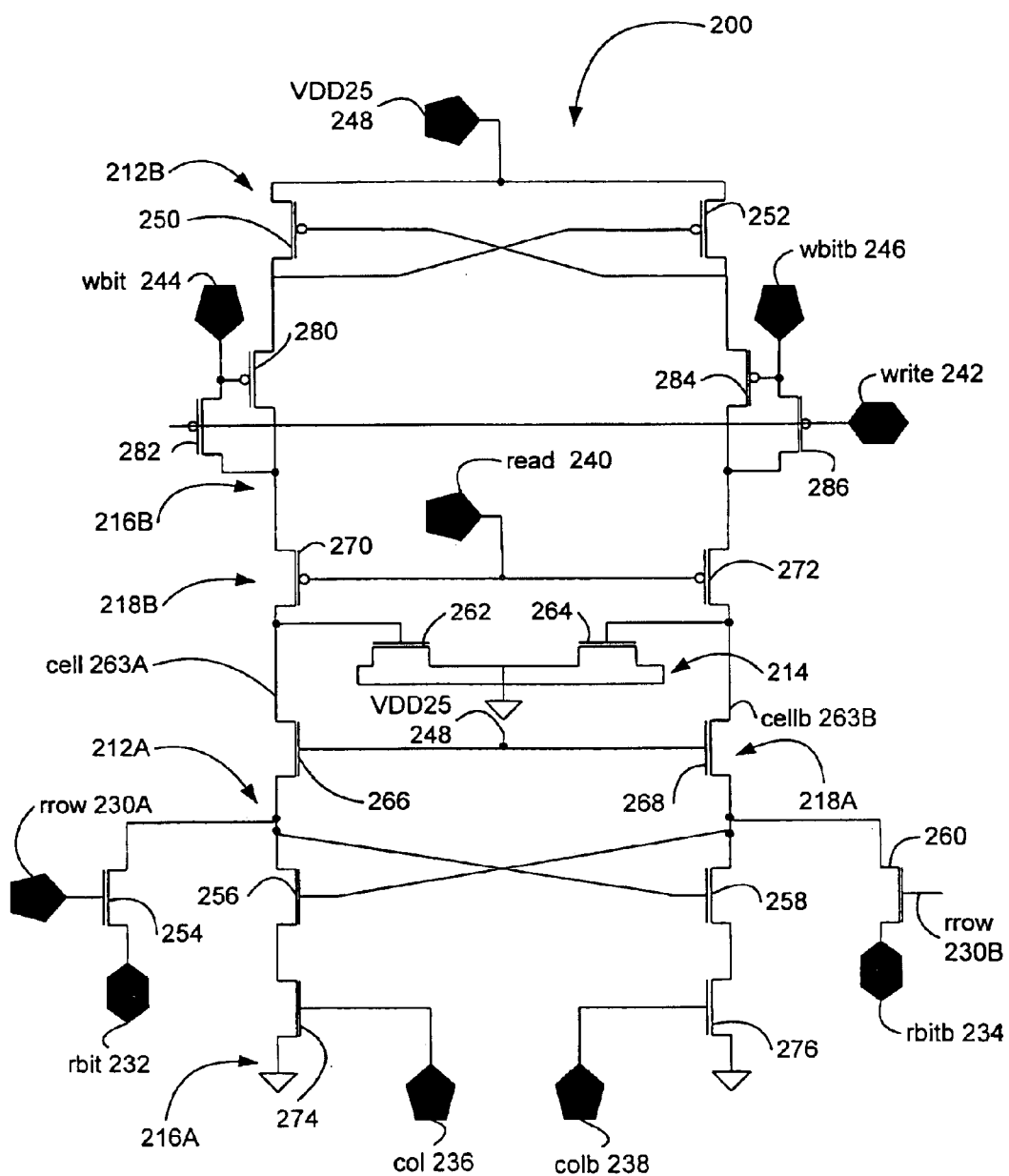
FIG. 2 illustrates a circuit diagram of a memory cell having a storage element and gate-ox fuses similar to the memory cell of FIG. 1 in accordance with one embodiment of the present invention.

A circuit diagram of one embodiment of a memory device or memory cell 200 (similar to the memory cell 10) is illustrated in FIG. 2. In this embodiment, the programming device (similar to the programming device 16 of FIG. 1) comprises programming device 216A and switch transistors 216B. The switch transistors 216B are used to select an appropriate fuse (i.e., fuse 262 or 264) and, during programming, allow a high voltage (about 6.0 volts or less, but generally about 5.0 volts for example) to be communicated to the selected fuse element.

Programming device 216A is used to keep the non-programmed (i.e., non-selected) transistor low when setting the state of the memory cell. That is, programming device 216A protects the non-selected fuse from floating high during programming. This prevents the non-selected fuse from accidentally blowing. In this embodiment, the programming device 216A comprises two NFet transistors 274 and 276, connected to col 236 and colb 238 via their respective gates. The switch transistors for programming 216B comprise four PFet transistors 280, 282, 284 and 286. In one embodiment of the present invention, wbit 244 is coupled to transistors 280 and 282; wbitb 246 is coupled to transistors 284 and 286; and write 242 is coupled to the gates of transistors 282 and 286 as shown.

The storage element in one embodiment of the present invention comprises a storage element 212A and 212B similar to the storage element 12 in FIG. 1. In the illustrated embodiment, storage element 212 comprises two PFet transistors 250 and 252 and four NFet transistors 254, 256, 258 and 260. As illustrated, transistor 254 is coupled to rbit 232 and rrow 230A; transistor 254 is coupled to row 230 via its gate; and transistor 260 is coupled to rrow 230B and to rbitb 234. It is anticipated that in one embodiment, the storage element 12 comprise a 6T transistor similar to the 6T transistor 312 illustrated in FIG. 3.

Additionally, the memory cell or memory device 200 includes at least one, but generally two or more, level shifter devices 218A and 218B to standoff the high voltage (about 6.5 volts but generally about 5.0 volts for example) used to set the state of the memory cell. Level shifting device 218A comprises two NFet transistors coupled to VDD 25 via their gates. Level shifter 218B comprises two PFet transistors 270 and 272 coupled to read 240 via their gates.

In one embodiment, level shifter devices 218A and 218B protect the other PFet and NFet transistors of the memory cell, when setting the state thereof. For example, PFet transistors 270 and 272 of level shifter 218B protect the other PFet transistors in the memory cell from the high voltage used during programming (i.e., setting the state of the memory cell). Likewise, the NFet transistors 266 and 268 of level shifter 218A protect the other NFet transistors in the memory cell from the high voltage used during programming.

In one embodiment of the present invention, the fuse element 214 comprises two thin gate-ox NFet transistors 262 and 264 coupled to cell 263A and cell 263B via their respective gates. In this embodiment, cellb 263B is coupled to transistors 272 and 268 of the level shifters and cell 263A is coupled to transistor 270 and 266 of the level shifters in addition to being coupled to transistors 262 and 264.

It is contemplated that, in one embodiment of the present invention, each memory cell consists of one storage element, one level shifter, one programming device, etc. as provided previously although other arrangements are contemplated. Furthermore, it is contemplated that a larger memory may consist of a plurality of memory cells, each memory cell consisting of a storage element, gated fuses, level shifter, etc. as provided previously.

Figure 3:
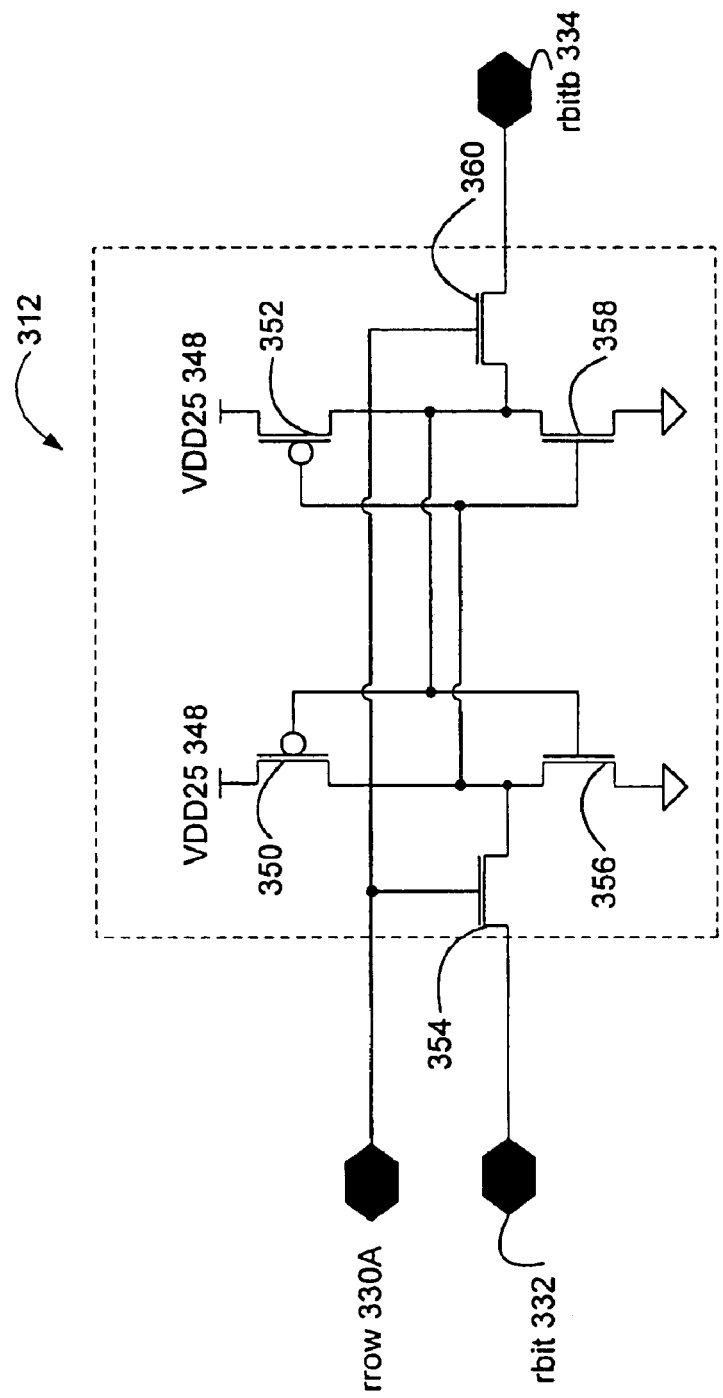
FIG. 3 illustrates a circuit diagram of a 6T storage element similar to that storage element illustrated in FIG. 2.

Referring to FIG. 3, one embodiment of a 6T CMOS SRAM storage element 312 is illustrated (similar to the storage elements 12 and 212 provided previously). In one example, the 6T CMOS SRAM storage element 312 comprises two PFet transistors 350 and 352 and four NFet transistors 354, 356, 358 and 360. A PFet transistor is turned on by a logic 0 at its gate and is adapted to pass or transmit a logic 1. An NFet transistor is turned on by a logic 1 at its gate and is adapted to pass or transmit a logic 0. The storage elements may, in one embodiment of the present invention, be arranged in a plurality of rows and columns.

The storage element 312 is either in a low or high stored memory state. If a logic 0 is stored (i.e., storage element 312 is in a low stored state) recording new and opposite information stores a logic 1 on the storage element (i.e., a high stored state). If logic 1 is recorded on storage element 312 (i.e., storage element 312 is in a high stored state) recording new and opposite information records logic 0 (i.e., changes the storage element to a low stored state).

In the illustrated embodiment, the transistor 350 is illustrated coupled to VDD, to transistors 356, 352, 358 and 360 via its gate and to transistors 354, 356, 352 and 358 via its drain connection. Transistor 352 is illustrated coupled to VDD, to transistors 358, 350, 354 and 356 via its gate and to transistors 360, 358, 350 and 356 via its drain connection.

Transistor 354 is illustrated coupled to at least the rbit 332 via its drain, to rrow 330A and transistor 360 via its gate, and to transistors 350, 356, 352 and 358 via its source connection. Transistor 360 is illustrated coupled to at least rbitb 334 via its drain, to rrow 330A and transistor 354 via its gate, and to transistors 350, 352, 356 and 358 via its source connection. Transistor 356 is illustrated coupled to at least transistors 350, 352, 360 and 358 via its gate and to transistors 350, 352, 354 and 358 via its drain connection. Transistor 358 is illustrated coupled to at least transistors 350, 352, 354, 356 via its gate and to transistors 350, 352, 360 and 356 via its drain connection. Transistors 356 and 358 each have their sources tied to VSS or ground.

Figure 4:
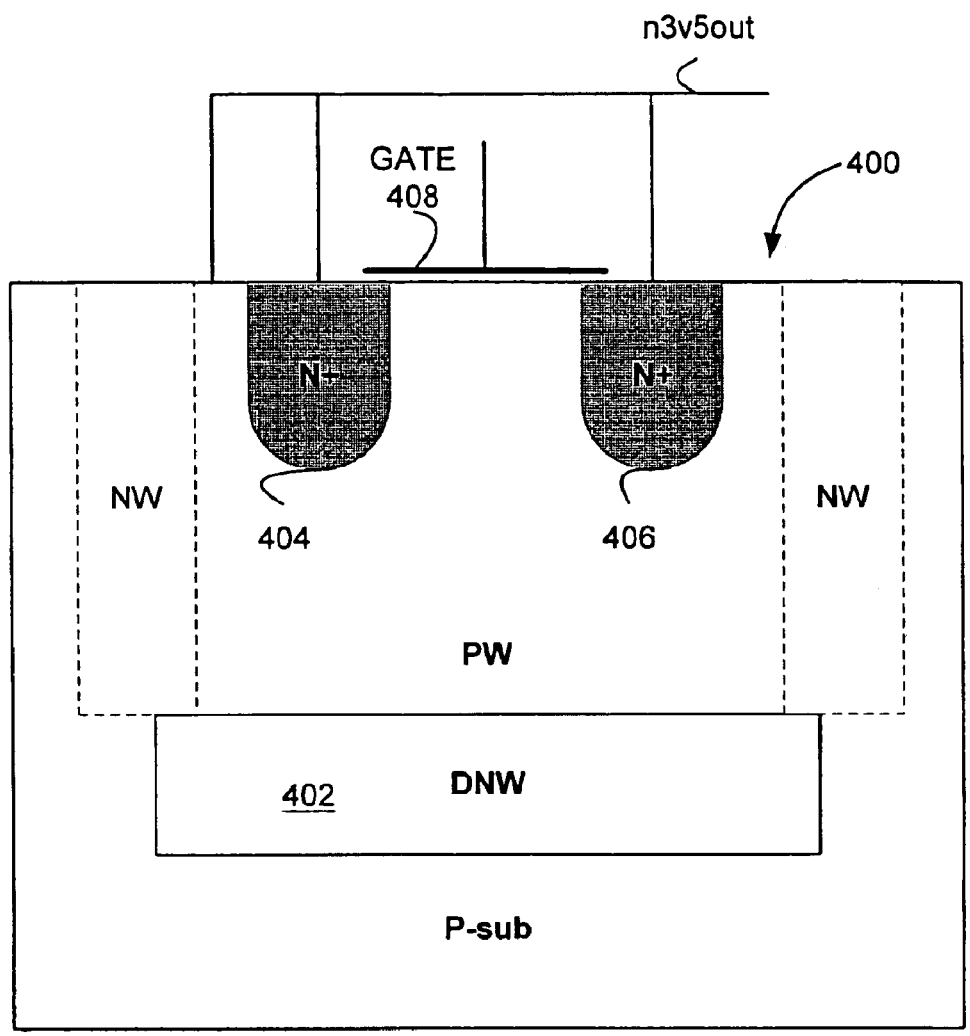
FIG. 4 illustrates a deep N-well MOSFET gate-ox fuse similar to the gate-ox fuses illustrated in FIG. 2.

FIG. 4 illustrates one embodiment of a deep N-well MOSFET gate-ox fuse 400 having an oxide less than about 2.5 nm in thickness used with a storage element according to one embodiment of the present invention. The fuse 400 includes a deep N-well 402. N3v5out is illustrated coupling source 404 and drain 406. The gate 408 is coupled to vload (not shown). This low voltage CMOS gate-ox fuse transistor is programmed by controlled pulses of electrical current having predetermined amplitude to rupture its gate oxide. The electrical power through the gate oxide cannot exceed a certain voltage and duration so as to avoid creating a void in the gate oxide.

The advantage of the deep N-well 402 is that it isolates the memory cell, enabling biasing the well, source and drain to about −3.5 volts. During a write operation about 2.5 volts for example is applied to the gate through the vload, thus effectively creating less than about a 6 volt voltage difference across the gate 408 oxide to rupture it. For example, in one embodiment about a 5 volt voltage difference is created across the gate oxide rupturing it.

When the gate oxide is blown, a conductive path is formed between the gate electrode and the source/drain regions of the gate-ox fuse transistor. This resistance, under controlled electrical pulses, will be in the hundreds of ohms range or less, which is 4 orders of magnitude lower than the resistance prior to programming. To apply the high programming voltage across the gate oxide of the gate-ox fuse transistor, the drain and source regions of the anti-fuse transistor are connected to ground, and a programming voltage is applied to the gate of the fuse transistor as provided previously.

Figure 5:
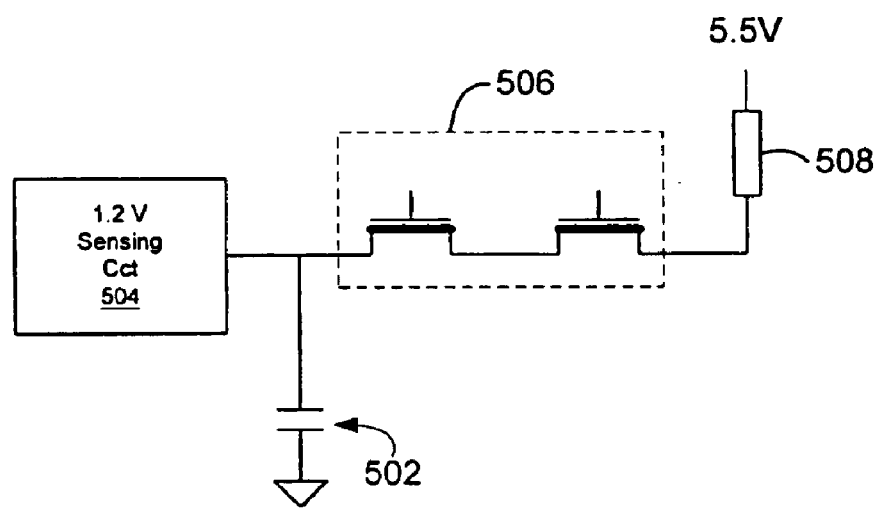
FIG. 5 illustrates another embodiment of a gate-ox fuse similar to the gate-ox fuse illustrated in FIG. 4.

FIG. 5 illustrates another embodiment of a gate ox-fuse having an oxide with a thickness of about 2.5 nm or less in which a deep N-well transistor is not used. The transistor's gate (shown as capacitor 502) is tied to a 1.2 volt sensing circuit 504 and a 5 volt tolerant switch 506. The 5 volt tolerant switch 506 is constructed from Input/Output MOS devices having a thicker gate oxide. For example, a 9 volt tolerant switch that may be used to implement this alternative embodiment of the present invention is described in "A High-Voltage Output Buffer Fabricated on a 2V CMOS Technology", by L. T. Clark, 1999 Symposium on VLSI Circuits Digest of Technical Papers (June 1999), the complete subject matter of which is incorporated herein by reference. These thicker gate oxide devices are connected to one end of a resistor 508, whose other end is tied to a supply of less than about 6.0 volts for example (a 5.5 volt supply is illustrated). Using appropriate switching, the oxide is ruptured to program the gate-ox fuse transistor.

Figure 6:
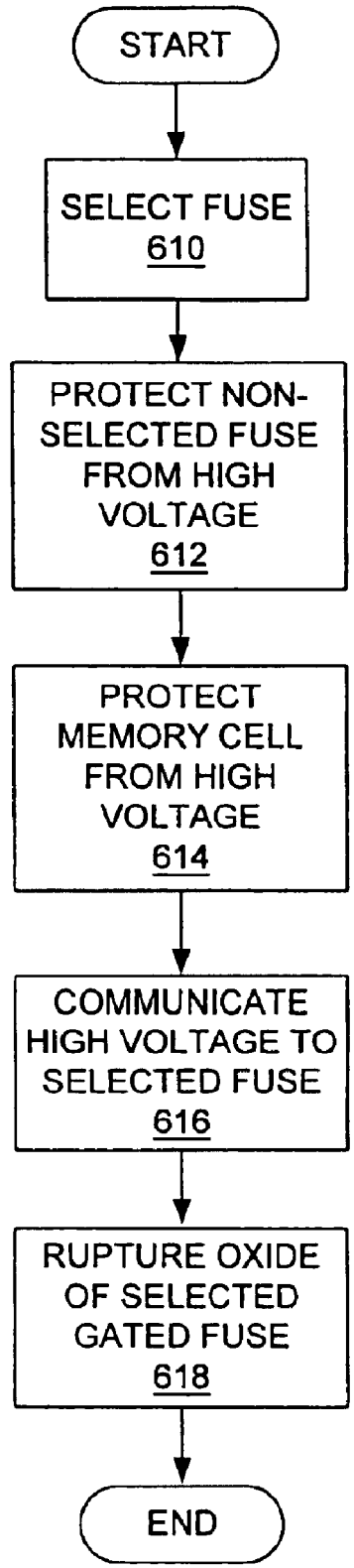
FIG. 6 illustrates a flow chart depicting one method of setting a state or programming a memory cell in accordance with one embodiment of the present invention.

One embodiment of the present invention comprises setting a state or programming a one-time programmable memory cell. FIG. 6 illustrates a flow chart for setting the state of a one-time programmable memory cell comprising a storage element and thin gate-ox fuses in accordance with one embodiment of the present invention. This method includes selecting one of the gate-ox fuses to be blown as illustrated by block 610. In one embodiment of the present invention, the switch transistors are used to select one of the two thin oxide gate fuses.

This method includes protecting the non-selected fuse from the high voltage so that this fuse doesn't accidentally blow as illustrated by block 612. In one embodiment of the present invention, the programming device protects the non-selected fuse, preventing it from floating high during programming (i.e., setting the state of the memory cell). Furthermore, the method includes protecting the memory cell by standing off the high voltage as illustrated by block 614. In one embodiment of the present invention, the level shifters stand off the high voltage during programming, protecting the other transistors in the memory cell. A high voltage is communicated to the selected fuse element as illustrated by block 616. In accordance with one embodiment the switch transistors are used to communicate the high voltage to the selected one of the two thin gate-ox fuses. The method includes rupturing the oxide gated fuse as illustrated by block 618. In one embodiment of the present invention this includes using the switch transistors to create at least about a six volt for example difference across the fuse. More specifically, this method includes creating about a five volt different across the fuse, rupturing the oxide and setting the state of the memory cell.

According to one embodiment of the present invention, the physical current used to rupture the thin oxide is dominated by a different mechanism than in prior art poly fuses and fuses fabricated according to 0.35 $\mu$m and 0.28 $\mu$m process technologies. In the present invention, the oxide rupture of the gated fuse is more controlled and the final programmed resistance is much lower than conventional devices, for example, the programmed resistance is in the range of 4 Kohms. A smaller variance on programmed resistance allows a more compact circuit design to determine the state of the memory cell.

Moreover, the thin gate-ox fuse requires little current to rupture the thin oxide, just a low voltage which may be provided directly from the system bus. Using a low voltage to rupture the oxide of the gated fuse eliminates the need for charge pump circuitry required to blow the poly fuses. Eliminating the need for the charge pump results in a simpler memory cell array design and smaller circuit area requirement. The simpler design and smaller circuit area requirement reduces manufacturing costs.

Another advantage of the present invention is the compact nature of the non-volatile one-time programmable memory using the thin oxide gated fuse in comparison to memory cells using poly fuses. For example, such memory cells using gated fuses may be 17 times smaller than memory cells using poly fuses. Integrating a multitude of gated fuses into a memory device on a single IC may be achieved according to the present invention.

Controlling the programmed state resistance of a one-time programming memory cell is also possible according to the present invention. The thin oxide gated fuse has a four order of magnitude difference in resistance between the before or un-blown and the after or blown states. This makes the circuitry design easier and more compact because the low programmed resistance, tighter resistance spread, and little or no resistance variation with time. Further, such large difference between the blown and un-blown states provides more reliability in the field, resulting in a less complicated sensing scheme.

The present invention may be implemented with various changes and substitutions to the illustrated embodiments. For example, the present invention may be implemented on substrates comprised of materials other than silicon, such as, for example, gallium, arsenide or sapphire.

Many modifications and variations of the present invention are possible in light of the above teachings. Thus, it is to be understood that, within the scope of the appended claims, the invention may be practiced otherwise than as described hereinabove.

What is claimed and desired to be secured by Letters Patent is:

1. A memory device comprising at least a level shifter adapted to stand off a high programming voltage to at least one fuse element in the memory device, wherein said high programming voltage is used to set a state of the memory device.

2. The memory device of claim 1 further comprising at least one storage element adapted to store data.

3. The memory device of claim 1, wherein said level shifter comprises at least one PFet transistor adapted to stand off said high voltage to at least one other PFet transistor in the memory device.

4. The memory device of claim 1, wherein said level shifter comprises at least one NFET transistor adapted to stand off said high voltage to at least one other NFet transistor in the memory device.

5. The memory device of claim 1 further comprising a programming device adapted to set said state of the memory device.

6. The memory device of claim 5, wherein said programming device comprises at least one switch transistor adapted to select at least a portion of said fuse element, enabling said high programming voltage to be communicated thereto.

7. The memory device of claim 5, wherein said programming device comprises at least one transistor adapted to keep at least a portion of said fuse element low when setting said state of the memory device.

8. The memory device of claim 1 wherein said fuse element comprises at least one gate-ox fuse adapted to selectively set said state of the memory device using said high programming voltage.

9. The memory device of claim 8, wherein said gate-ox fuse comprises at least two coupled Nfet transistors.

10. The memory device of claim 8, wherein said gate-ox fuse is a thin gate-ox fuse.

11. The memory device of claim 10, wherein an oxide of said thin gate-ox fuse is about 2.5 nm thick or less.

12. A memory device comprising at least a level shifter adapted to stand off a programming voltage to at least one of two gated fuses in the memory device, wherein said programming voltage is used to set a state of the memory device.

13. The memory device of claim 12 further comprising at least one storage element adapted to store data.

14. The memory device of claim 12, wherein said level shifter comprises at least one PFet transistor adapted to stand off said programming voltage to at least one other PFet transistor in the memory device.

15. The memory device of claim 12, wherein said level shifter comprises at least one NEET transistor adapted to stand off said programming voltage to at least one other NFet transistor in the memory device.

16. The memory device of claim 12 further comprising a programming device adapted to set said state of the memory device.

17. The memory device of claim 16, wherein said programming device comprises at least one switch transistor adapted to select at least a portion of at least one of said two gated fuses enabling said programming voltage to be communicated thereto.

18. The memory device of claim 16, wherein said programming device comprises at least one transistor adapted to keep at least a portion of at least one of said two gated fuses low when setting said state of the memory device.

19. The memory device of claim 12 wherein at least one of said two gated fuses is a gate-ox fuse.

20. The memory device of claim 19, wherein said gate-ox fuse comprises at least two coupled Nfet transistors.

21. The memory device of claim 19, wherein said gate-ox fuse is a thin gate-ox fuse.

22. The memory device of claim 21, wherein an oxide of said thin gate-ox fuse is about 2.5 nm thick or less.

23. A method of programming a memory device comprising:
   selecting at least one fuse to be blown using a programming voltage; and
   standing off said programming voltage to at least one non-selected fuse.

24. The method of claim 23 comprising using a level shifter having at least one Nfet transistor to stand off said programming voltage to at least one NFet transistor in the memory device.

25. The method of claim 23 comprising using a level shifter having at least one PFet device to stand off said programming voltage to at least one PFet transistor in the memory device.

26. The method of claim 23, wherein at least one of said selected and non-selected fuses is a gated fuse.

27. The method of claim 26 wherein said gated fuse is a thin oxide gated fuse.

28. The method of claim 27, wherein an oxide of said thin oxide gated fuse is about 2.5 nm thick or less.

* * * * *